US006833581B1

(12) United States Patent
Hui et al.

(10) Patent No.: US 6,833,581 B1
(45) Date of Patent: Dec. 21, 2004

(54) STRUCTURE AND METHOD FOR PREVENTING PROCESS-INDUCED UV RADIATION DAMAGE IN A MEMORY CELL

(75) Inventors: Angela Hui, Fremont, CA (US); Minh V. Ngo, Fremont, CA (US); Ning Cheng, Cupertino, CA (US); Jaeyong Park, Sunnyvale, CA (US); Jean Y. Yang, Sunnyvale, CA (US); Kouros Ghandehari, Santa Clara, CA (US); Hirokazu Tokuno, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 10/460,282

(22) Filed: Jun. 12, 2003

(51) Int. Cl.⁷ .............................................. H01L 29/788
(52) U.S. Cl. ...................................... 257/317; 257/296
(58) Field of Search ................................. 257/317, 296

(56) References Cited

U.S. PATENT DOCUMENTS 5,994,157 A * 11/1999 Aggas et al. ................. 438/30
6,020,590 A * 2/2000 Aggas et al. ............ 250/370.09
6,410,210 B1 * 6/2002 Gabriel ........................ 430/315
6,627,536 B1 * 9/2003 Gabriel ........................ 438/634
6,765,254 B1 * 7/2004 Hui et al. ..................... 257/296

* cited by examiner

Primary Examiner—David Nelms
Assistant Examiner—Thao P. Le
(74) Attorney, Agent, or Firm—Farjami & Farjami LLP

(57) ABSTRACT

According to one exemplary embodiment, a structure comprises a substrate. The structure further comprises at least one memory cell situated on the substrate. The at least one memory cell may be, for example, a flash memory cell, such as a SONOS flash memory cell and may include a gate situated over an ONO stack. The structure further comprises an interlayer dielectric layer situated over the at least one memory cell and over the substrate. According to this exemplary embodiment, the structure further comprises a UV radiation blocking layer situated directly over the interlayer dielectric layer, where the UV radiation blocking layer is selected from the group consisting of silicon-rich oxide and silicon-rich nitride. The UV radiation blocking layer may have a thickness of between approximately 1500.0 Angstroms and approximately 2000.0 Angstroms, for example.

13 Claims, 2 Drawing Sheets

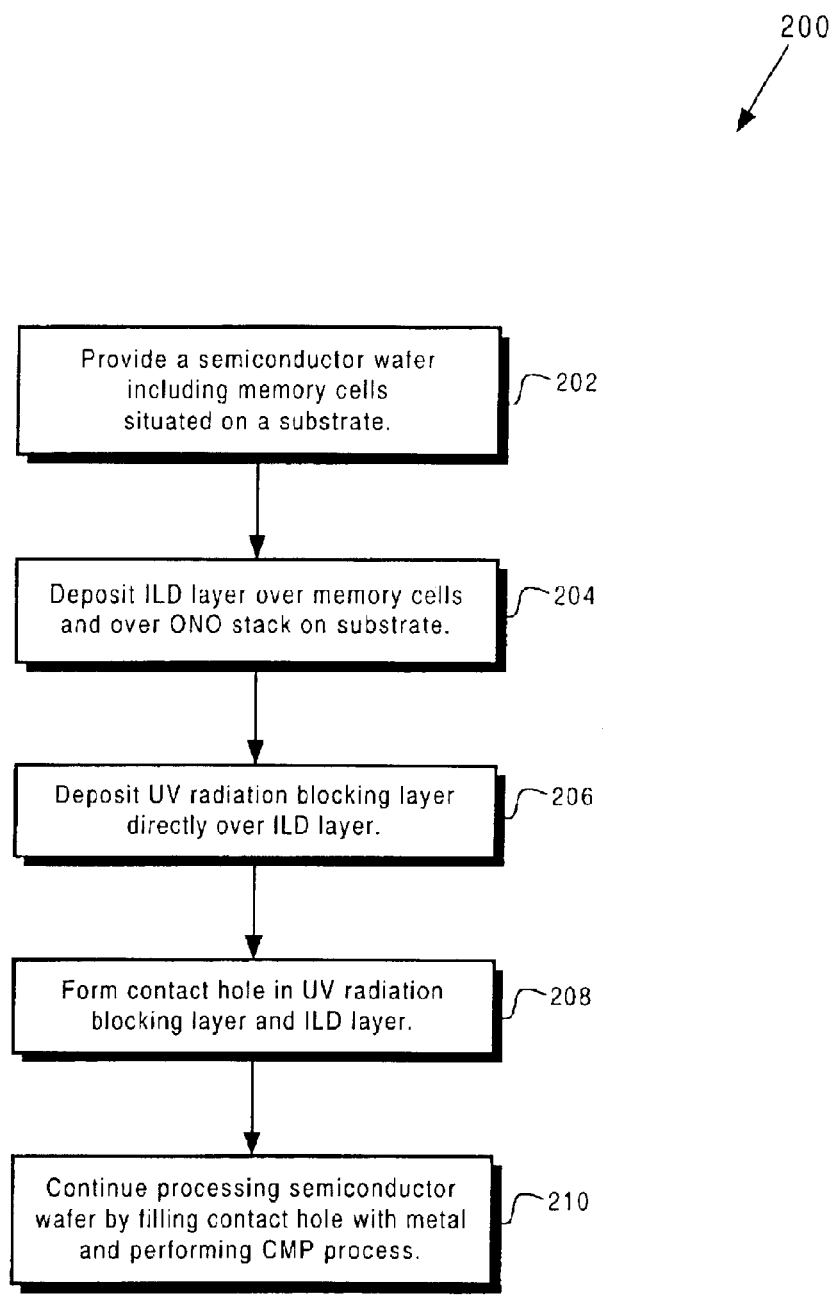

US 6,833,581 B1

STRUCTURE AND METHOD FOR PREVENTING PROCESS-INDUCED UV RADIATION DAMAGE IN A MEMORY CELL

TECHNICAL FIELD

The present invention is generally in the field of semiconductor devices. More particularly, the present invention is in the field of semiconductor memory devices.

BACKGROUND ART

Non-volatile memory devices are currently in widespread use in electronic components that require the retention of information when electrical power is terminated. Non-volatile memory devices include read-only-memory (ROM), programmable-read-only memory (PROM), erasable-programmable-read-only-memory (EPROM), and electrically-erasable-programmable-read-only-memory (EEPROM) devices. EEPROM devices differ from other non-volatile memory devices in that they can be electrically programmed and erased. Flash memory devices are similar to EEPROM devices in that memory cells can be programmed and erased electrically. However, flash memory devices enable the erasing of all memory cells in the device using a single current pulse.

In flash memory devices, Silicon-Oxide-Nitride-Oxide-Silicon ("SONOS") memory cells, such as Advanced Micro Devices' ("AMD") MirrorBit™ memory cell, can be utilized to achieve long data retention, low-voltage operation, and fast programming speed. A SONOS memory cell, such as Advanced Micro Devices' ("AMD") MirrorBit™ memory cell, includes a polycrystalline silicon ("poly") gate situated on an Oxide-Nitride-Oxide ("ONO") stack. The ONO stack is a three layer structure including a bottom oxide layer situated on a substrate, a nitride layer situated over the bottom oxide layer, and a top oxide layer situated over the nitride layer. During programming, electrical charge is transferred from the substrate to the silicon nitride layer in the ONO stack. Voltages are applied to the gate and drain creating vertical and lateral electric fields, which accelerate the electrons along the length of the channel. As the electrons move along the channel, some of them gain sufficient energy to jump over the potential barrier of the bottom oxide layer and become trapped and stored in the nitride layer.

In a flash memory cell, such as the SONOS flash memory cell discussed above, threshold voltage ("Vt"), which can be defined as the gate voltage required to obtain a desired source-to-drain current, must be controlled to achieve optimal memory cell performance and power consumption. If Vt is too high, for example, memory cell performance can decrease. One cause of unacceptably high Vt is ultraviolet ("UV") radiation-induced charge in dielectric areas and layers in and adjacent to the memory cell, such as gate spacers and ONO stack layers. UV radiation-induced charging results from semiconductor fabrication processes that produce UV radiation, such as plasma etching and chemical vapor deposition ("CVD") processes. When Vt is too high as a result of UV radiation-induced charge, adjusting processing parameters, such as implantation dosage, may not be effective in sufficiently lowering Vt. Thus, UV radiation-induced charge causes decreased Vt control in the memory cell, which decreases memory cell performance.

The UV radiation-induced charge discussed above comprises electrons and holes, which have a high energy as a result of being induced by high-energy UV radiation. As a result, the high-energy electrons and holes induced by the high-energy UV radiation can damage critical layers of the memory cell, such as the bottom oxide layer of the ONO stack, which serves as a "tunnel" for electrons to charge the nitride layer of the ONO stack during memory cell programming. As a result of damage to the bottom oxide layer of the ONO stack caused by UV radiation, memory cell reliability is reduced.

Thus, there is a need in the art for an effective structure to prevent UV radiation from decreasing performance and reliability of a memory cell, such as a SONOS flash memory cell.

SUMMARY

The present invention is directed to structure and method for preventing process-induced UV radiation damage in a memory cell. The present invention addresses and resolves the need in the art for an effective structure to prevent UV radiation from decreasing performance and reliability of a memory cell, such as a SONOS flash memory cell.

According to one exemplary embodiment, a structure comprises a substrate. The structure further comprises at least one memory cell situated on the substrate. The at least one memory cell may be, for example, a flash memory cell, such as a SONOS flash memory cell and may include a gate situated over an ONO stack. The structure further comprises an interlayer dielectric layer situated over the at least one memory cell and over said substrate. The interlayer dielectric layer may comprise, for example, BPSG or BPTEOS.

According to this exemplary embodiment, the structure further comprises a UV radiation blocking layer situated directly over the interlayer dielectric layer, where the UV radiation blocking layer is selected from the group consisting of silicon-rich oxide and silicon-rich nitride. The UV radiation blocking layer may have a thickness of between approximately 1500.0 Angstroms and approximately 2000.0 Angstroms, for example. The structure may further comprise a contact hole extending through the UV radiation blocking layer and the interlayer dielectric layer. In one embodiment, the invention is a method for fabricating the above-discussed structure. Other features and advantages of the present invention will become more readily apparent to those of ordinary skill in the art after reviewing the following detailed description and accompanying drawings.

BRIEF DESCRIPTION OF THE DRAWINGS

FIG. 2 is a flow chart corresponding to exemplary method steps according to one embodiment of the present invention.

DETAILED DESCRIPTION OF THE INVENTION

Figure 1:
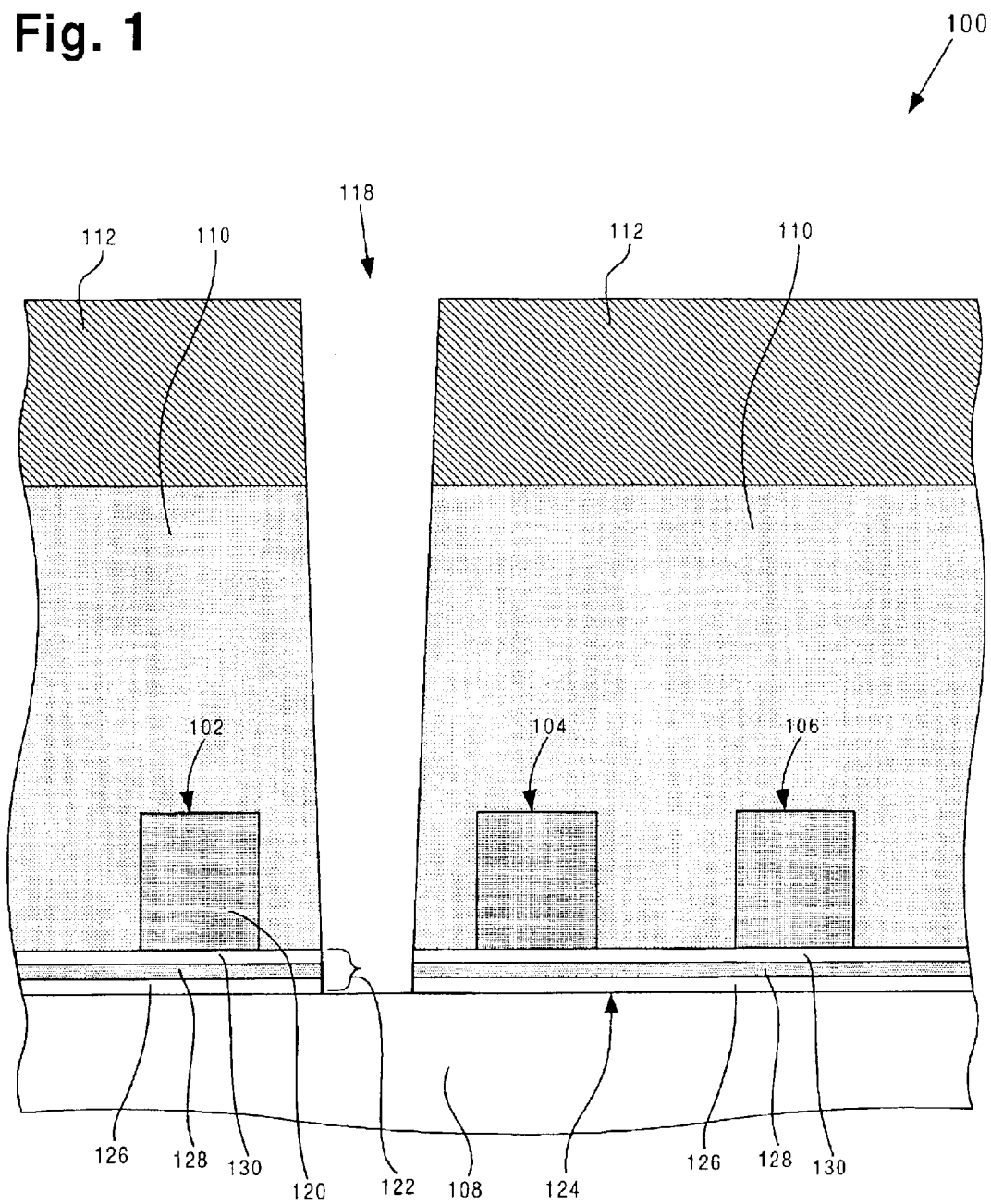
FIG. 1 illustrates a cross-sectional view of a structure including exemplary memory cells, in accordance with one embodiment of the present invention.

The present invention is directed to structure and method for preventing process-induced UV radiation damage in a memory cell. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

The present invention involves the utilization of a thick antireflective coating ("ARC") layer comprising silicon-rich oxide or silicon-rich nitride to protect memory cells from being damaged by UV radiation which can be caused by subsequent CVD and etch processes. As will be discussed in detail below, by effectively protecting memory cells from the adverse effects of UV radiation, the present invention advantageously achieves increased threshold voltage control, which results in increased memory cell performance and increase memory cell reliability. The present invention can be applied to any non-volatile memory, including flash memory. Although a SONOS ("Silicon-Oxide-Nitride-Oxide-Silicon") memory cell, which utilizes an ONO ("Oxide-Nitride-Oxide") stack to store charge, is utilized to illustrate the present invention, the present invention can also be applied to memory cells utilizing floating gate memory technology.

FIG. 1 shows a cross-sectional view of an exemplary structure in accordance with one embodiment of the present invention. Structure 100 includes memory cells 102, 104, and 106, silicon substrate 108, interlayer dielectric (ILD) layer 110. UV radiation blocking layer 112, and contact hole 118. Structure 100 can be, for example, part of non-volatile memory array, such as a flash memory array. Memory cell 102 includes gate 120, ONO stack 122, gate spacers (not shown in FIG. 1), and source and drain regions (not shown in FIG. 1).

As shown in FIG. 1, memory cell 102 includes ONO stack 122, which is situated on top surface 124 of silicon substrate 108. In the present embodiment, memory cell 102 can be a SONOS memory cell, such as an AMD MirrorBit™ memory cell. In one embodiment, memory cell 102 can be a floating gate memory cell. ONO stack 122 is a three-layer structure, which comprises silicon oxide layer 126, silicon nitride layer 128, and silicon oxide layer 130. ONO stack 122 can be formed by depositing and patterning an ONO layer in a manner known in the art.

Also shown in FIG. 1, memory cell 102 further includes gate 120, which is situated over ONO stack 122. Gate 120 can comprise polycrystalline silicon, which can be deposited over ONO stack 122 by a low-pressure chemical vapor deposition ("LPCVD") process and patterned in a manner known in the art. By way of example, gate 120 can have a thickness of between approximately 1000.0 Angstroms and approximately 3000.0 Angstroms. It is noted that although only memory cell 102 is described in detail herein to preserve brevity, memory cells 104 and 106 are similar to memory cell 102 in composition and manner of fabrication.

Further shown in FIG. 1, ILD layer 110 is situated over memory cells 102, 104, and 106 and over ONO stack 122 on top surface 124 of silicon substrate 108. ILD layer 110 can comprise borophosphosilicate glass ("BPSG"), borophosphorous tetraethyl orthosilicate ("BPTEOS"), or other appropriate dielectric material. By way of example, ILD layer 110 can have a thickness of between approximately 4500.0 Angstroms and approximately 8500.0 Angstroms.

Also shown in FIG. 1, UV radiation blocking layer 112 is situated directly over ILD layer 110. UV radiation blocking layer 112 can comprise silicon-rich nitride or silicon-rich oxide. By way of example, UV radiation blocking layer 112 can have an initial thickness of between approximately 1500.0 Angstroms and approximately 2000.0 Angstroms.

UV radiation blocking layer 112 can be deposited over ILD layer 110 using a plasma-enhanced chemical vapor deposition ("PECVD") process, for example. The present invention utilizes UV radiation blocking layer 112 to block UV radiation induced by subsequent fabrication processes.

As discussed above, UV radiation associated with semiconductor fabrication processes, such as plasma etching and CVD processes, can cause induced charges to be stored in dielectric layers situated in and adjacent to memory cells, such as memory cells 102, 104, and 106. The UV radiation-induced charges can adversely affect memory cell performance by undesirably increasing Vt (i.e., threshold voltage). UV radiation-induced charges can also reduce memory cell reliability by damaging silicon oxide layer 126, which provides a "tunnel" for electrons to charge silicon nitride layer 128 during programming of memory cell 102. Thus, by utilizing UV radiation blocking layer 112, the present invention effectively blocks UV radiation that can adversely affect memory cells 102, 104, and 106. As a result, the present invention achieves increased control of memory cell threshold voltage, which advantageously results in increased memory cell performance and decreased memory cell power consumption. Additionally, by utilizing the UV radiation blocking layer discussed above to prevent UV radiation from damaging critical memory cell layers, such as silicon oxide layer 126, the present invention advantageously achieves increased memory cell reliability.

Also shown in FIG. 1, contact hole 118 is situated between memory cells 102 and 104 and extends through UV radiation blocking layer 112, ILD layer 110, and ONO stack 122. Contact hole 118 can be formed, for example, by depositing and patterning a layer of photoresist on UV radiation blocking layer 112 to determine a contact hole opening. UV radiation blocking layer 112, ILD layer 110, and ONO stack 122 can then be etched using a plasma etch to form contact hole 118. UV radiation blocking layer 112 also functions as an antireflective coating layer to reduce unwanted reflections during lithographic printing of the contact hole opening, which allows contact hole critical dimension ("CD") to be more accurately controlled. As a result, a contact hole having a desirably small CD can be formed.

Contact hole 118 can be filled with tungsten or other appropriate metal to from a contact, which provides a connection between the source or drain (not shown) of a memory cell and a subsequently deposited layer of interconnect metal. After contact hole 118 is filled with metal, such as tungsten, a chemical mechanical polishing ("CMP") process is utilized to remove excess metal from the top surface of UV radiation blocking layer 112. During the CMP process a portion of UV radiation blocking layer 112 is also removed, which reduces the thickness of UV radiation blocking layer 112. However, UV radiation blocking layer 112 has a sufficient initial thickness such that after the CMP process has removed a portion of UV radiation blocking layer 112, the remaining portion of UV radiation blocking layer 112 effectively blocks UV radiation cause by subsequent fabrication processes. By way of example, the remaining portion of UV radiation blocking layer 112 can have a thickness greater than approximately 500.0 Angstroms.

Thus, UV radiation blocking layer 112 also functions as a CMP stop layer. As a result, no additional sacrificial oxide cap layer is required to protect UV radiation blocking layer 112 during the CMP process. Consequently, by not requiring formation of an oxide cap layer over UV radiation blocking layer 112, the present invention advantageous reduces processing steps and manufacturing cost.

FIG. 2 shows a flow chart illustrating an exemplary method according to one embodiment of the present invention. Certain details and features have been left out of flow chart 200 that are apparent to a person of ordinary skill in the art. For example, a step may consist of one or more substeps or may involve specialized equipment or materials, as known in the art.

At step 202, a semiconductor wafer is provided, which includes memory cells, such as memory cells 102, 104, and 106 in FIG. 1, situated on a silicon substrate, such as silicon substrate 108. At step 204, an ILD layer, such as ILD layer 110, is deposited over the memory cells and over an ONO stack on the silicon substrate. For example, ILD layer 110 can be deposited over memory cells 102, 104, and 106 and over ONO stack 122 on silicon substrate 108 using a CVD process. At step 206, a UV radiation blocking layer is deposited directly over the ILD layer. For example, UV radiation blocking layer 112 can be deposited over ILD layer 110 using a PECVD process. UV radiation blocking layer 112 blocks UV radiation, which can adversely affect memory cell performance and reliability. At step 208, a contact hole is formed in UV radiation blocking layer, ILD layer, and ONO stack. For example, contact hole 118 can be formed by depositing and patterning a layer of photoresist to determine a contact hole opening over UV radiation blocking layer 112. UV radiation blocking layer 112, ILD layer 110, and ONO stack 122 can then be etched using a plasma etch to form contact hole 118. At step 210, processing of the semiconductor wafer can continues by filling contact hole 118 with metal and utilizing a CMP process to remove excess metal on top surface of UV radiation blocking layer 112.

Thus, as discussed above, by utilizing UV radiation blocking layer 112 to effectively block UV radiation associated with subsequent fabrication processes, the present invention advantageously prevents UV radiation from adversely affecting memory cells. As a result, the present invention advantageously achieves increased memory cell performance and reliability.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, structure and method for preventing process-induced UV radiation damage in a memory cell have been described.

What is claimed is:

1. A structure comprising:

a substrate;

at least one memory cell situated on said substrate;

an interlayer dielectric layer situated over said at least one memory cell and over said substrate;

a UV radiation blocking layer situated directly over said interlayer dielectric layer, said UV radiation blocking layer being selected from the group consisting of silicon-rich oxide and silicon-rich nitride.

2. The structure of claim 1 wherein an oxide cap layer is not situated directly above said UV radiation blocking layer.

3. The structure of claim 1 wherein said UV radiation blocking layer has a thickness of between approximately 1500.0 Angstroms and approximately 2000.0 Angstroms.

4. The structure of claim 1 further comprising a contact hole extending through said UV radiation blocking layer and said interlayer dielectric layer.

5. The structure of claim 1 wherein said at least one memory cell comprises a gate situated over an ONO stack.

6. The structure of claim 1 wherein said interlayer dielectric layer is selected from the group consisting of BPSG and BPTEOS.

7. The structure of claim 1 wherein said at least one memory cell is a flash memory cell.

8. The structure of claim 1 wherein said at least one memory cell is a SONOS flash memory cell.

9. A structure comprising a substrate, at least one memory cell situated on said substrate, an interlayer dielectric layer situated over said at least one memory cell and over said substrate, said structure being characterized in that:

a UV radiation blocking layer is situated directly over said interlayer dielectric layer, wherein said UV blocking layer is selected from the group consisting of silicon-rich oxide and silicon-rich nitride.

10. The structure of claim 9 wherein an oxide cap layer is not situated directly above said UV radiation blocking layer.

11. The structure of claim 9 wherein said UV radiation blocking layer has a thickness of between approximately 1500.0 Angstroms and approximately 2000.0 Angstroms.

12. The structure of claim 9 wherein said at least one memory cell is a flash memory cell.

13. The structure of claim 9 wherein said at least one memory cell is a SONOS flash memory cell.

* * * * *